United States Patent
Zhu et al.

(10) Patent No.: US 12,363,856 B2
(45) Date of Patent: Jul. 15, 2025

(54) IMMERSED LIQUID COOLING HEAT DISSIPATION SYSTEM

(71) Applicant: CANAAN CREATIVE CO., LTD., Beijing (CN)

(72) Inventors: Yanbin Zhu, Beijing (CN); Nangeng Zhang, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 289 days.

(21) Appl. No.: 18/005,343

(22) PCT Filed: Jul. 12, 2021

(86) PCT No.: PCT/CN2021/105782
§ 371 (c)(1),
(2) Date: Jan. 12, 2023

(87) PCT Pub. No.: WO2022/012469
PCT Pub. Date: Jan. 20, 2022

(65) Prior Publication Data
US 2023/0284413 A1    Sep. 7, 2023

(30) Foreign Application Priority Data

Jul. 14, 2020  (CN) .......................... 202021378357.0
Jul. 14, 2020  (CN) .......................... 202021383262.8

(51) Int. Cl.
*H05K 7/20* (2006.01)
(52) U.S. Cl.
CPC ..... *H05K 7/20236* (2013.01); *H05K 7/20154* (2013.01); *H05K 7/20254* (2013.01); *H05K 7/20272* (2013.01); *H05K 7/203* (2013.01)
(58) Field of Classification Search
CPC ........... H05K 7/20236; H05K 7/20154; H05K 7/20254; H05K 7/20272; H05K 7/203;
(Continued)

(56) References Cited

U.S. PATENT DOCUMENTS 9,801,311 B2     10/2017  Nakanishi et al.
10,782,751 B1 *  9/2020   Gauthier ............. F24D 17/0042
(Continued)

FOREIGN PATENT DOCUMENTS

CN     103249284 A     8/2013
CN     107690267 A     2/2018
(Continued)

OTHER PUBLICATIONS

International Search Report mailed Sep. 28, 2021 in PCT Application No. PCT/CN2021/105782.

*Primary Examiner* — Jacob R Crum
(74) *Attorney, Agent, or Firm* — Sheppard Mullin Richter & Hampton LLP

(57) ABSTRACT

Disclosed is an immersed liquid cooling heat dissipation system, which comprises a liquid cooling module, an oil path circulation device, and a plurality of computing devices to undergo heat dissipation. Each computing device comprises a frame, a control module, a power module, and computing modules. The liquid cooling module comprise a first device slot tank, a second device slot tank, a return flow slot tank, and a flow-equalizing plate. The return flow slot tank is located between the first device slot tank and the second device slot tank, wherein the flow-equalizing plate is disposed in the first device slot tank and the second device slot tank, and the computing devices are disposed on the flow-equalizing plate. The frame is internally provided with a power module accommodating region used for accommodating the power module and a computing module accommodating region used for accommodating the computing module.

22 Claims, 13 Drawing Sheets

(58) Field of Classification Search
CPC .......... H05K 7/20781; G06F 2200/201; G06F 1/206; G06F 1/20
See application file for complete search history.

(56) References Cited

U.S. PATENT DOCUMENTS

| | | | |
|---|---|---|---|
| 2014/0216688 A1* | 8/2014 | Shelnutt | F28D 15/0266 |
| | | | 165/104.13 |
| 2015/0181762 A1 | 6/2015 | Boyd et al. | |
| 2016/0381838 A1 | 12/2016 | Nakanishi et al. | |
| 2017/0127558 A1 | 5/2017 | Best | |
| 2018/0153058 A1* | 5/2018 | Hirai | H05K 7/20236 |
| 2018/0246550 A1* | 8/2018 | Inaba | H05K 7/20254 |
| 2020/0037467 A1* | 1/2020 | Ishinabe | H05K 7/20236 |
| 2020/0257342 A1* | 8/2020 | Mao | H01M 10/6568 |
| 2020/0352058 A1* | 11/2020 | Zhong | H05K 7/20236 |

FOREIGN PATENT DOCUMENTS

| | | |
|---|---|---|
| CN | 207885064 U | 9/2018 |
| CN | 209420177 U | 9/2019 |
| CN | 110730604 A | 1/2020 |
| CN | 111065245 A | 4/2020 |
| JP | H11-68369 A | 3/1999 |
| JP | 2017010408 A | 1/2017 |
| WO | 2019061721 A1 | 4/2019 |

\* cited by examiner

IMMERSED LIQUID COOLING HEAT DISSIPATION SYSTEM

TECHNICAL FIELD

The present invention relates to the technical field of heat dissipation, in particular to an immersed liquid cooling heat dissipation system.

BACKGROUND

A computing device is an electronic device used for high-speed computing, such as a blockchain server used to run a specific algorithm and communicate with a remote server and then obtain the corresponding virtual currency. The progress of existing industries has promoted the evolution of various computing devices to be cooled, including blockchain servers, towards automation and intelligence, and the optimization of computing device performance requires the support by more and more computing chips. The use of a large number of computing chips will inevitably greatly increase the heat dissipation. Existing blockchain servers often use forced air cooling, but with the increase in heat dissipation density, air cooling is gradually difficult to meet the heat dissipation requirements. The liquid-cooled heat dissipation method with higher heat dissipation efficiency is one of the options in the future. The flow distribution of the immersion-type single-phase liquid cooling is difficult to achieve consistency, resulting in large temperature differences between blockchain servers in different locations, and blockchain servers with small flow rates are prone to high temperatures, which affects the heat dissipation of the entire system.

SUMMARY

The object of the present invention is to provide an immersed liquid cooling heat dissipation system, and to enable improved heat dissipation equilibrium.

In order to achieve the above object, the immersed liquid cooling heat dissipation system of the present invention comprises a liquid cooling module, a cooling circulation device, and a plurality of computing devices to be cooled. The computing devices to be cooled comprise a frame, a control module, a power module, and computing modules. The liquid cooling module comprises flow-equalizing plates, and the computing devices to be cooled are arranged on the flow-equalizing plates. A power module accommodating region for accommodating the power module and a computing module accommodating region for accommodating the computing modules are provided in the frame. The frame has a plurality of liquid-through ports for immersed heat dissipation, and a plurality of flow-equalizing holes are formed on the flow-equalizing plate.

In an embodiment of the above immersed liquid cooling heat dissipation system, the liquid-through ports are disposed on a bottom portion and a top portion of the frame. The computing module comprises a heat sink, the heat sink has heat sink grooves, and the heat sink grooves are arranged vertically.

In an embodiment of the above immersed liquid cooling heat dissipation system, the flow-equalizing plate has a first flow-equalizing hole portion corresponding to the power module and a second flow-equalizing hole portion corresponding to the computing modules. An opening ratio of the first flow-equalizing hole portion is smaller than that of the second flow-equalizing hole portion.

In an embodiment of the above immersed liquid cooling heat dissipation system, the computing device to be cooled further comprises a connecting module, and the flow-equalizing plate comprises a hole-free portion corresponding to the connecting module.

In an embodiment of the above immersed liquid cooling heat dissipation system, there are a plurality of flow-equalizing plates, and adjacent flow-equalizing plates are snap-fitted with each other.

In an embodiment of the above immersed liquid cooling heat dissipation system, both ends of the flow-equalizing plate are respectively provided with a first positioning portion and a second positioning portion. The first positioning portion is in a shape of vertical bent, and the second positioning portion is in an inverted-U shape.

In an embodiment of the above immersed liquid cooling heat dissipation system, the liquid cooling module further comprises a first device slot tank, a second device slot tank, and a return flow slot tank located between the first device slot tank and the second device slot tank, and the flow-equalizing plates are arranged in the first device slot tank and the second device slot tank.

In one embodiment of the above immersed liquid cooling heat dissipation system, the liquid cooling module comprises liquid oil inlets and a liquid oil outlet. The liquid oil inlets are disposed on the first device slot tank and the second device slot tank and the liquid oil outlet is disposed on the return flow slot tank.

In an embodiment of the above immersed liquid cooling heat dissipation system, the first device slot tank, the second device slot tank and the return flow slot tank each are disposed along an extending direction, and the first device slot tank and the second device slot tank have a first end and a second end opposite to each other along the extending direction. The liquid oil inlets and the liquid oil outlet are disposed on the first end.

In an embodiment of the above immersed liquid cooling heat dissipation system, the liquid oil inlets are lower than a bottom portion of the computing devices to be cooled.

In an embodiment of the above immersed liquid cooling heat dissipation system, the system further comprises a distribution box and a control cabinet, and the distribution box and the control cabinet are disposed at the second end.

In an embodiment of the above immersed liquid cooling heat dissipation system, the distribution box is connected to the computing devices to be cooled through a power supply line, and a first line-reception part for receiving the power supply line is provided on a top portion of the first device slot tank and the second device slot tank on a side close to the return flow slot tank.

In an embodiment of the above immersed liquid cooling heat dissipation system, the control cabinet is connected to the computing devices to be cooled through a signal line, and a second line-reception part for receiving the signal line is provided on a top portion of the first device slot tank and the second device slot tank on a side away from the return flow slot tank.

In an embodiment of the above immersed liquid cooling heat dissipation system, the system further comprises a plurality of oil return ports, and the oil return ports are disposed on wall surfaces between the first device slot tank and the return flow slot tank and between the second device slot tank and the return flow slot tank.

In an embodiment of the above immersed liquid cooling heat dissipation system, the system further comprises a flow guide disposed obliquely at a bottom portion of the flow-equalizing plate, and the flow guide is disposed at an end of the flow-equalizing plate close to the liquid oil inlets.

In an embodiment of the above immersed liquid cooling heat dissipation system, there are a plurality of flow guides, and one of the plurality of flow guides that is closest to the liquid oil inlets has a longest length.

In one embodiment of the above immersed liquid cooling heat dissipation system, the cooling circulation device further comprises an oil circulation cooling assembly, a water circulation cooling assembly, a PID thermostat and a control module connected to the PID thermostat. The oil circulation cooling assembly is connected to the liquid cooling module, and the water circulation cooling assembly exchanges heat with the oil circulation cooling assembly. The oil circulation cooling assembly comprises a circulating oil pump, the water circulation cooling assembly comprises a circulating water pump, and the control module is connected to the circulating oil pump and the circulating water pump.

In an embodiment of the above immersed liquid cooling heat dissipation system, the water circulation cooling assembly further comprises a cooling tower, the cooling tower comprises a spray pump, and the control module is connected to the spray pump.

In an embodiment of the above immersed liquid cooling heat dissipation system, the cooling tower comprises a fan, and the control module is connected to the fan.

In one embodiment of the above immersed liquid cooling heat dissipation system, the oil circulation cooling assembly and the water circulation cooling assembly are connected through a plate heat exchanger, and when an outlet oil temperature of the plate heat exchanger is higher than a predetermined value, the control module controls the fan to start.

In an embodiment of the above immersed liquid cooling heat dissipation system, there are a plurality of fans.

In an embodiment of the above immersed liquid cooling heat dissipation system, the control module comprises a power switch-off unit, and the power switch-off unit comprises a water pump failure detecting element, an oil pump failure detecting element and a water pressure detecting element.

In an embodiment of the above immersed liquid cooling heat dissipation system, the control module comprises an integrated alarm unit, and the integrated alarm unit comprises an oil temperature detecting element, a water temperature detecting element, a water level detecting element and an oil level detecting element.

The present invention will be described in detail below in conjunction with the accompanying drawings and specific embodiments, but not as a limitation of the present invention.

Figure 1:
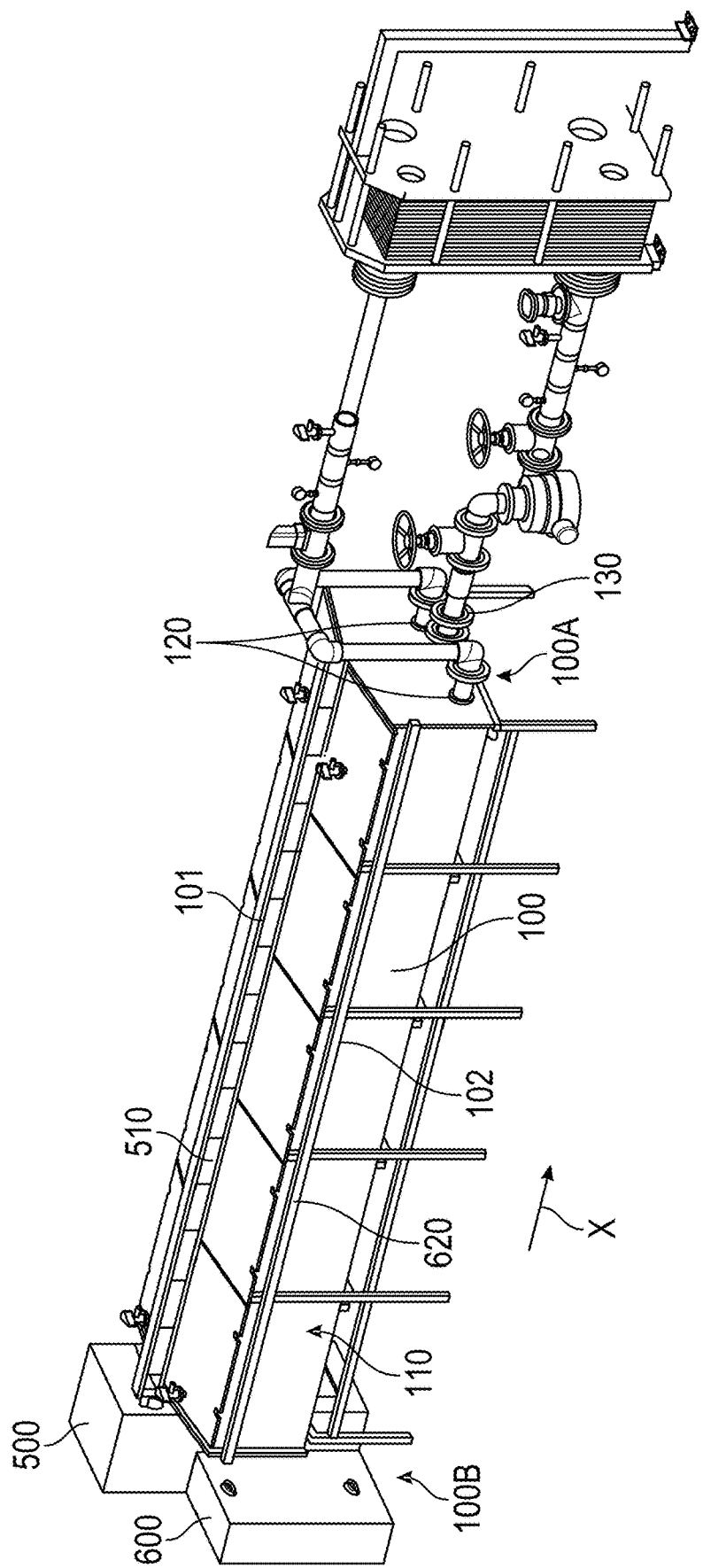
FIG. 1 is a three-dimensional structural view of an immersed liquid cooling heat dissipation system of the present invention.

In the Figures, Reference Signs are as Follows
10: Immersed liquid cooling heat dissipation system
100: Liquid cooling module
100A: First end
100B: Second end
101: First line-reception part
102: Second line-reception part
110: Unit tank body
120: Liquid oil inlet
130: Liquid oil outlet
140: First device slot tank
150: Second device slot tank
160: Return flow slot tank
170: Oil return port
180: Cover plate
190: Flow-equalizing plate
190S: Flow-equalizing hole
191: First flow-equalizing hole portion
192: Second flow-equalizing hole portion
193: Hole-free portion
194: First Positioning portion
195: Second positioning portion
198: Flow guide
300: Computing device
310: Frame
310S: Liquid-through port
320: Power module
330: Computing module
340: Connecting module
X: Extending direction
500: Distribution box
510: Power supply line
600: Control cabinet
700: Oil circulation cooling assembly
710: Circulating oil pump
800: Water circulation cooling assembly
810: Circulating water pump
820: Cooling tower 821: Spray pump
822: Fan
900: Plate heat exchanger
30: PID thermostat
40: Control module
41: Power switch-off unit
411: Water pump failure detecting element
412: Oil pump failure detecting element
413: Water pressure detecting element
42: Integrated alarm unit
421: Oil temperature detecting element
422: Water temperature detecting element
423: Water level detecting element
424: Oil level detecting element

DETAILED DESCRIPTION

The technical solution of the present invention will be described in detail below in conjunction with the accompanying drawings and specific embodiments for further understanding of the objectives, solutions and effects of the present invention. But it is not intended to limit the scope of the appended claims of the present invention.

References to "an embodiment", "another embodiment", "present embodiment" and the like in the specification mean that the described embodiment may comprise specific features, structures or characteristics, but not every embodiment has to comprise these specific features, structures or characteristics. Furthermore, such expressions do not mean the same embodiment. Furthermore, when specific features, structures or characteristics are described in conjunction with an embodiment, whether or not there is an explicit description, it has been indicated that it is within the knowledge of those skilled in the art to combine such features, structures or characteristics into other embodiments.

Certain terms are used in the description and the following claims to refer to specific components or parts, and those skilled in the art should understand that users or manufacturers of the technology may refer to the same components or parts with different designations or terms. This description and the following claims do not use different designations or terms as the way to distinguish components or parts with differences, but distinguish the components or parts by their differences in functionalities as the distinguishing criterion. "Comprise" and "include" mentioned in the entire specification and following claims are open-ended terms, so they should be interpreted as "include but not limited to." In addition, the word "connect" herein comprises any means for direct and indirect connection.

It should be noted that, in the description of the present invention, in the case where orientations or positional relationships indicated by terms such as "latitudinal", "longitudinal", "upper", "lower", "front", "rear", "left", "right", "vertical", "horizontal", "top", "bottom", "inner" and "outer" occur, they are based on the orientations or positional relationships shown in the drawings, and are only for the convenience of describing the present invention and simplifying the description. They do not indicate or imply that the devices or elements referred to must have a specific orientation, be constructed and operated in a specific orientation, and thus should not be construed as limiting the invention. For the sake of clarity, the sequential terms such as "first", "second", "third" and "fourth" mentioned herein are used to distinguish an element, region, or part from another same or similar element, region, part, rather than used to limit specific elements, regions, and parts.

Figure 2:
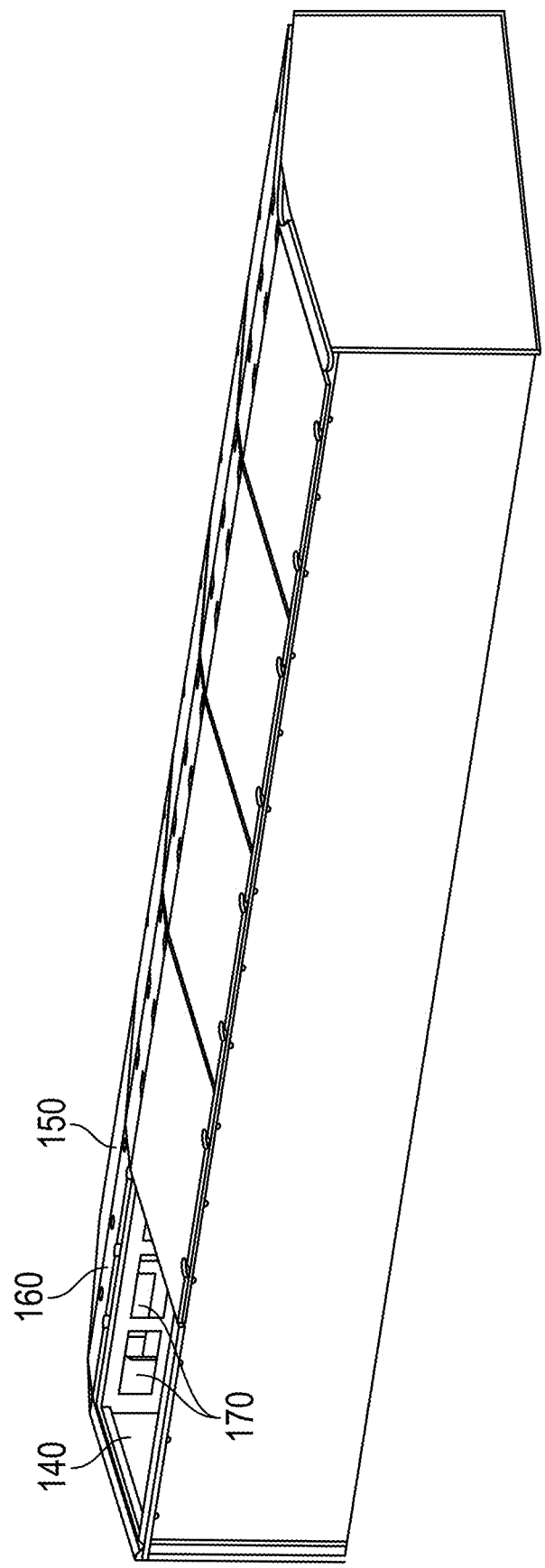
FIG. 2 is a three-dimensional structural view of a liquid cooling module of the immersed liquid cooling heat dissipation system of the present invention.
Figure 3:
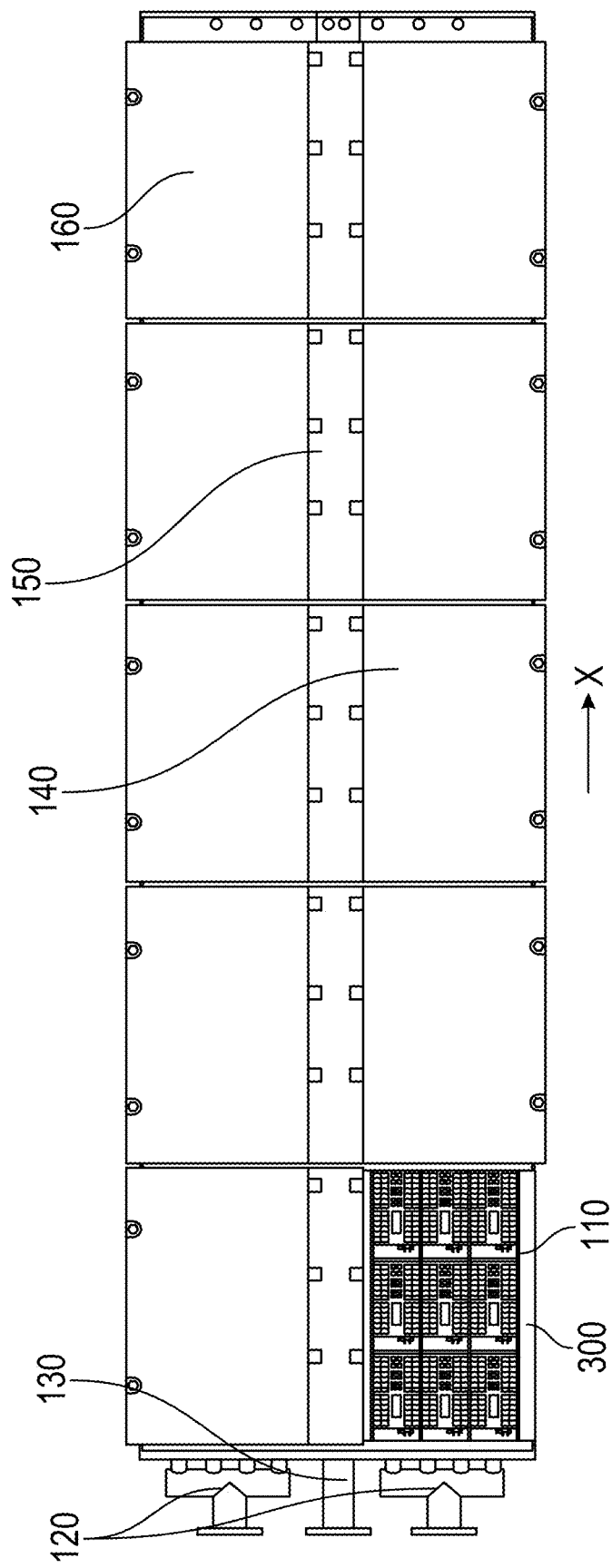
FIG. 3 is a top view of the liquid cooling module of the immersed liquid cooling heat dissipation system of the present invention.
Figure 4:
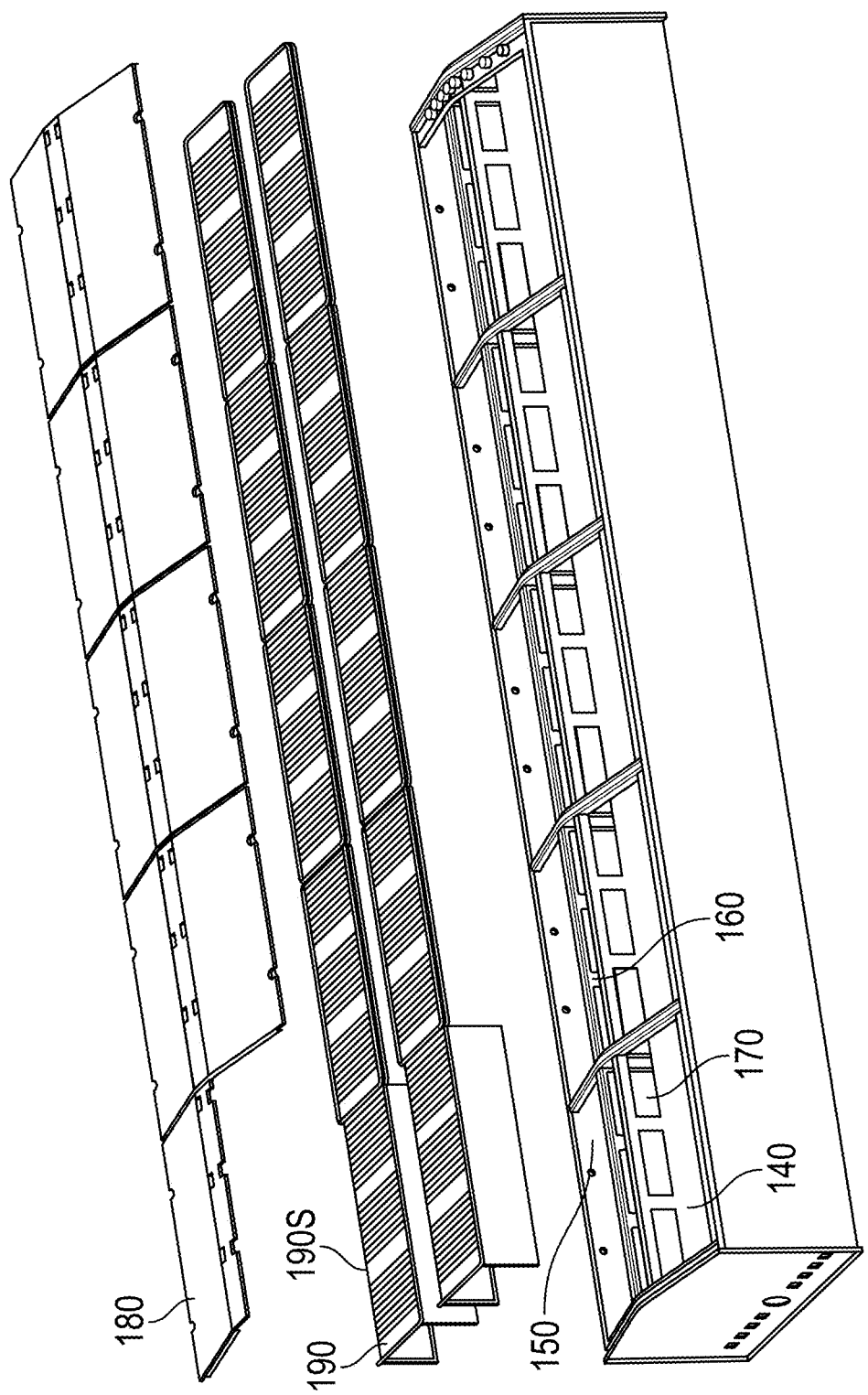
FIG. 4 is an exploded three-dimensional structural view of the liquid cooling module of the immersed liquid cooling heat dissipation system of the present invention.

As shown in FIGS. 1 to 4, FIG. 1 is a three-dimensional structural view of an immersed liquid cooling heat dissipation system of the present invention, FIGS. 2 and 3 are a three-dimensional structural view and a top view of a liquid cooling module of the immersed liquid cooling heat dissipation system of the present invention respectively, and FIG. 4 is an exploded three-dimensional structural view of the liquid cooling module of the immersed liquid cooling heat dissipation system of the present invention. The immersed liquid cooling heat dissipation system 10 of the present invention comprises a liquid cooling module 100 and a cooling circulation device. The liquid cooling module 100 is connected to the cooling circulation device, wherein a plurality of computing devices 300 to be cooled, for example, blockchain servers are immersed in cooling liquid in the liquid cooling module 100. The cooling liquid is circulated through the cooling circulation device, that is, the cold cooling liquid is continuously input and the hot cooling liquid is drawn out, to dissipate heat for the plurality of computing devices 300 to be cooled disposed in the liquid cooling module 100. Wherein, the liquid cooling module 100 is, for example, a liquid cooling box containing cooling liquid, and a plurality of computing devices 300 to be cooled are disposed immersed in the cooling liquid, or the liquid cooling module 100 is, for example, a liquid cooling plate, and the plurality of computing devices 300 to be cooled are disposed as attached to the liquid cooling plate and the present invention is not limited thereto.

Figure 5:
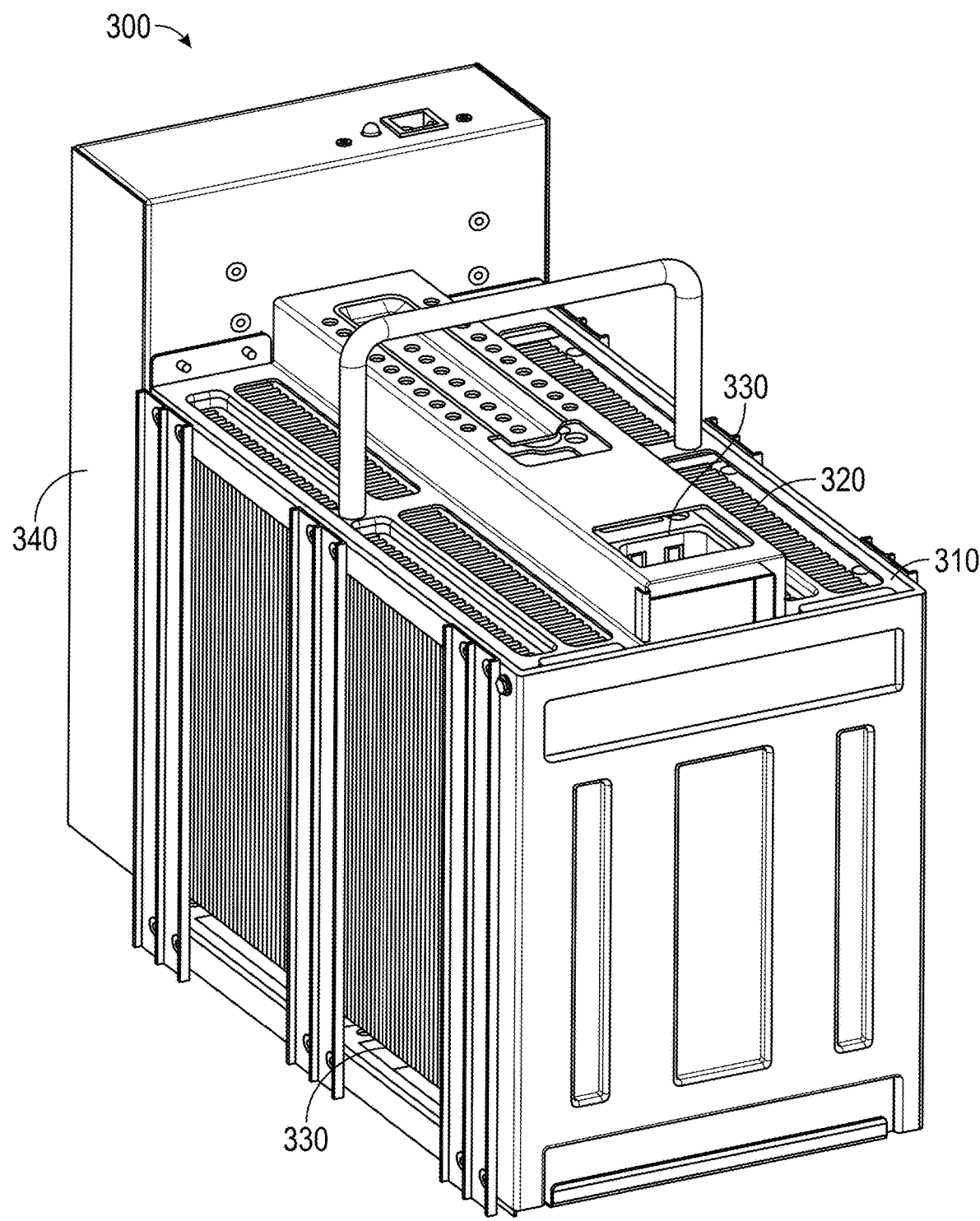
FIG. 5 is a three-dimensional structural view of a computing device to be cooled in the immersed liquid cooling heat dissipation system of the present invention.
Figure 6:
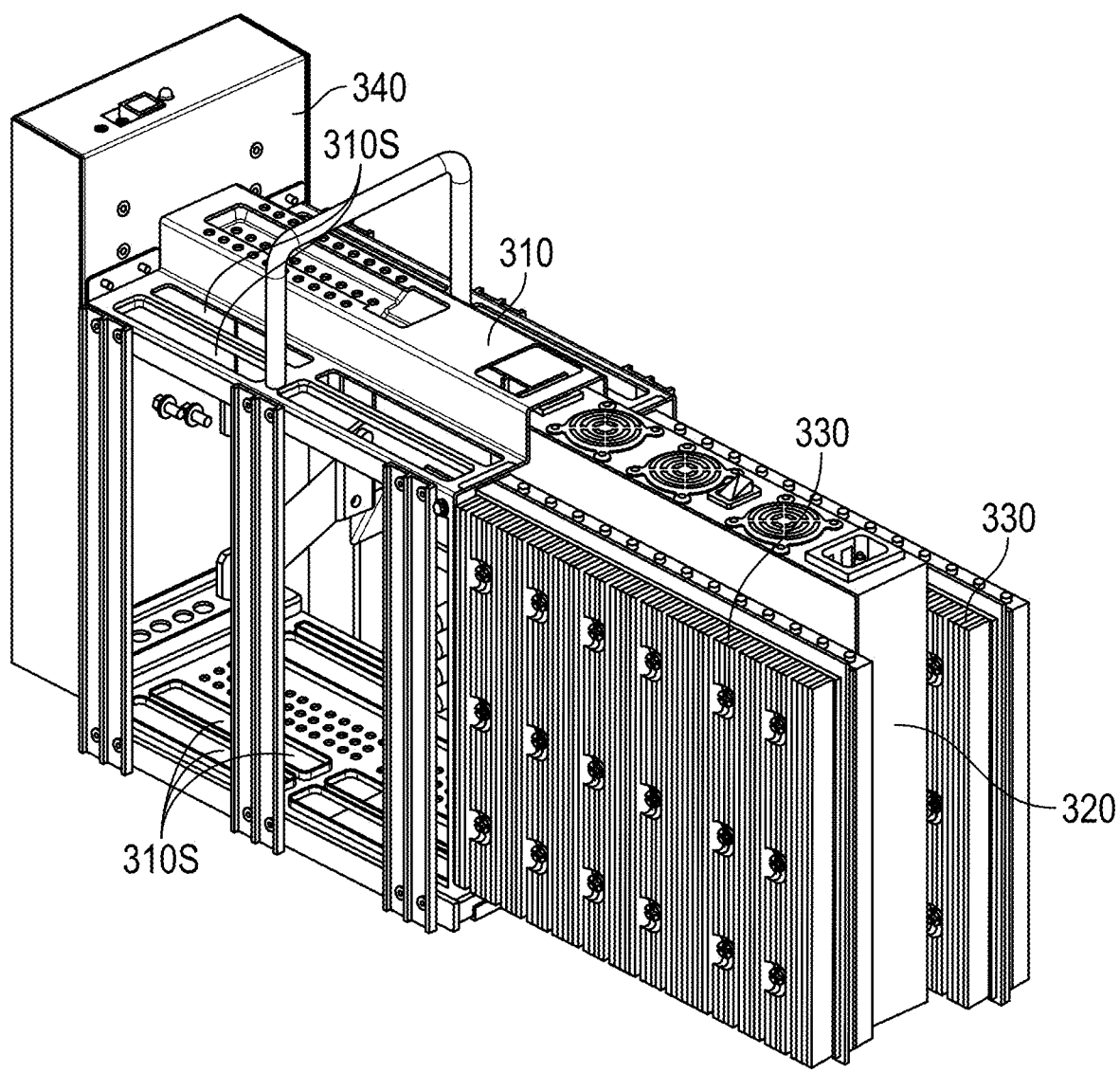
FIG. 6 is a three-dimensional structural view of an exploded structure of a computing device to be cooled in the immersed liquid cooling heat dissipation system of the present invention.

As shown in FIGS. 5 and 6, FIG. 5 is a three-dimensional structural view of a computing device to be cooled in the immersed liquid cooling heat dissipation system of the present invention, and FIG. 6 is a three-dimensional structural view of an exploded structure of the computing device to be cooled in the immersed liquid cooling heat dissipation system of the present invention. The computing device to be cooled 300 comprises a frame 310, a control module (not shown), a power module 320, and computing modules 330. A power module accommodating region for accommodating the power module 320 and a computing module accommodating region for accommodating the computing module 330 are provided in the frame 310. That is, both the power module 320 and the computing module 330 are accommodated in the frame 310.

Moreover, the frame 310 for the computing devices 300 to be cooled has a plurality of liquid-through ports 310S for immersed heat dissipation, and there are a plurality of flow-equalizing holes 190S on the flow-equalizing plate 190 of the liquid cooling module 100.

The immersed liquid cooling heat dissipation system of the present invention is provided with a flow-equalizing plate, which could greatly improve the flow consistency for the computing devices to be cooled in different parts of the liquid cooling module, such that the temperatures of the computing devices to be cooled in different parts are consistent, and both the computing power and the energy efficiency ratio can reach a relatively good state.

Wherein, the liquid cooling module 100 comprises a first device slot tank 140, a second device slot tank 150, a return flow slot tank 160 and a flow-equalizing plate 190. The first device slot tank 140 and the second device slot tank 150 are located on two sides of the return flow slot tank 160, or in other words, the return flow slot tank 160 is located between the first device slot tank 140 and the second device slot tank 150. The flow-equalizing plate 190 is disposed in the first device slot tank 140 and the second device slot tank 150, and the computing devices 300 to be cooled are disposed on the flow-equalizing plate 190.

The immersed liquid cooling heat dissipation system of the present invention is provided with the return flow slot tank, which is located between the device slot tanks on two sides. The cooling liquid absorbs the heat of the computing devices to be cooled located in the device slot tanks and then flows back and is cooled through the return flow slot tank. The structure is compact and is high in the heat dissipation efficiency.

The liquid-through ports 310S are disposed on a bottom portion and a top portion of the frame 10, and the computing module 330 comprises a heat sink. The heat sink has heat sink grooves, and the heat sink grooves are arranged vertically. That is, the fin gaps of the heat sink are combined with the liquid-through ports 310S on the upper and lower bottom plate portions of the frame 310 to form liquid flow channels, and the cooling liquid enters the computing devices 300 to be cooled from the below of the computing devices 300 to be cooled through the flow-equalizing plate 190, and takes away heat by surging from bottom to top through the liquid flow channels. Generally, after the cooling liquid gushes out from the computing devices 300 to be cooled, it flows to both sides and falls down. It can be said that the top portion of the corresponding heat sink of the computing device to be cooled 300 is the highest liquid level of the cooling liquid.

Wherein, the frame 310 is, for example, a sheet metal punched piece, and the liquid ports 310S include, for example, punched slot holes arranged in pairs, and slideways are formed between punched side edges of adjacent punched slot holes. The power module 320 and the computing module 330 enter and exit the power module accommodating region and computing module accommodating region through the slideways respectively.

In this embodiment, the computing module accommodating region comprises a first computing module accommodating region and a second computing module accommodating region, and the first computing module accommodating region and the second computing module accommodating region are located on two sides of the power module accommodating region respectively. The computing module accommodating regions are symmetrically located on the two sides of the power module accommodating region, and the overall weighting of the computing devices is more reasonable.

According to the flow direction of the single-phase fluid (refer to FIG. 3), there are a plurality of computing devices 300 to be cooled arranged in series. Since the resistance of the fluid to different parts of the computing devices 300 to be cooled is different, inconsistency in flow of the computing devices 300 to be cooled in different parts is caused.

Figure 7:
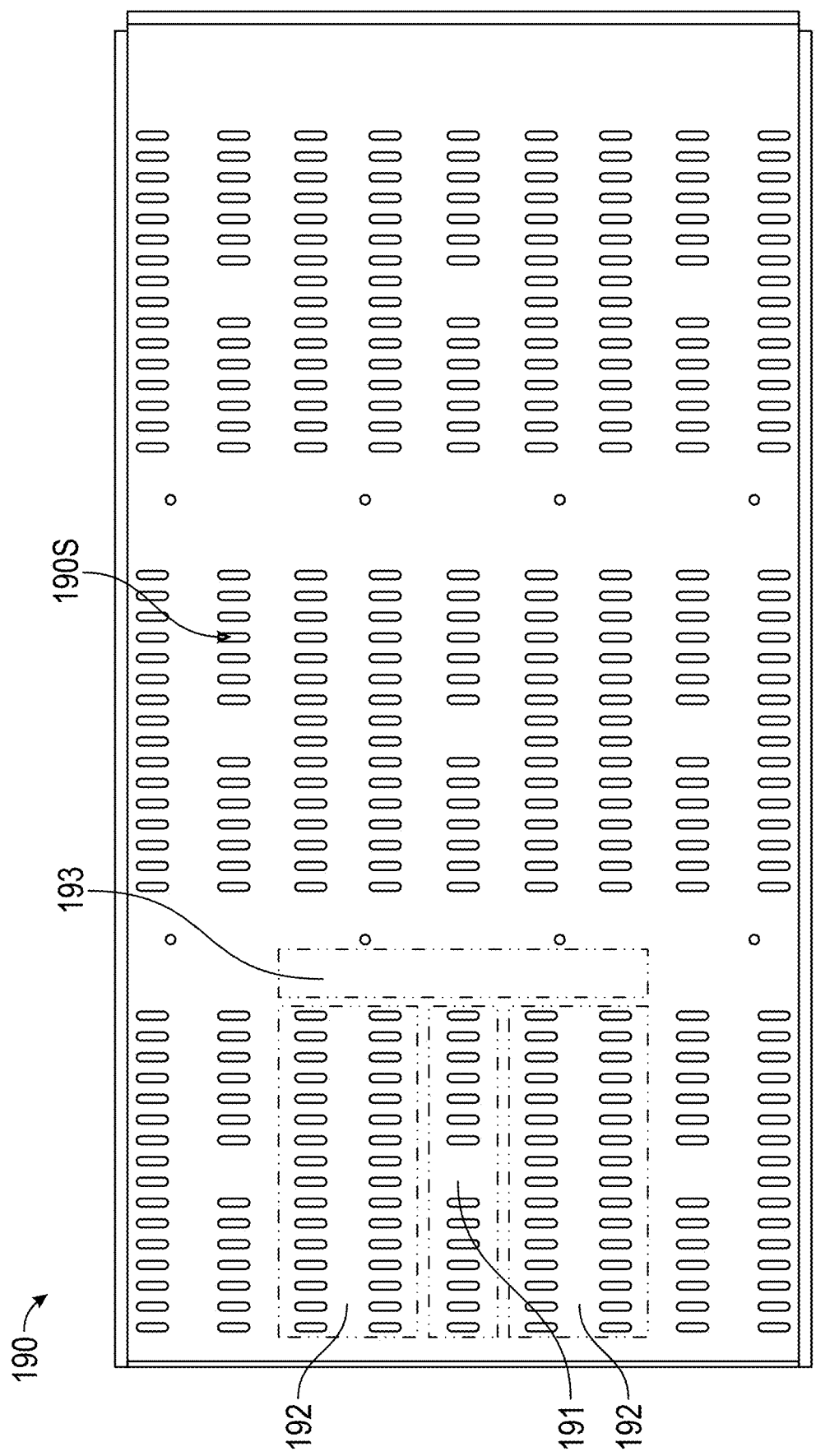
FIG. 7 is a structural schematic view of a flow-equalizing plate of the immersed liquid cooling heat dissipation system of the present invention.
Figure 8:
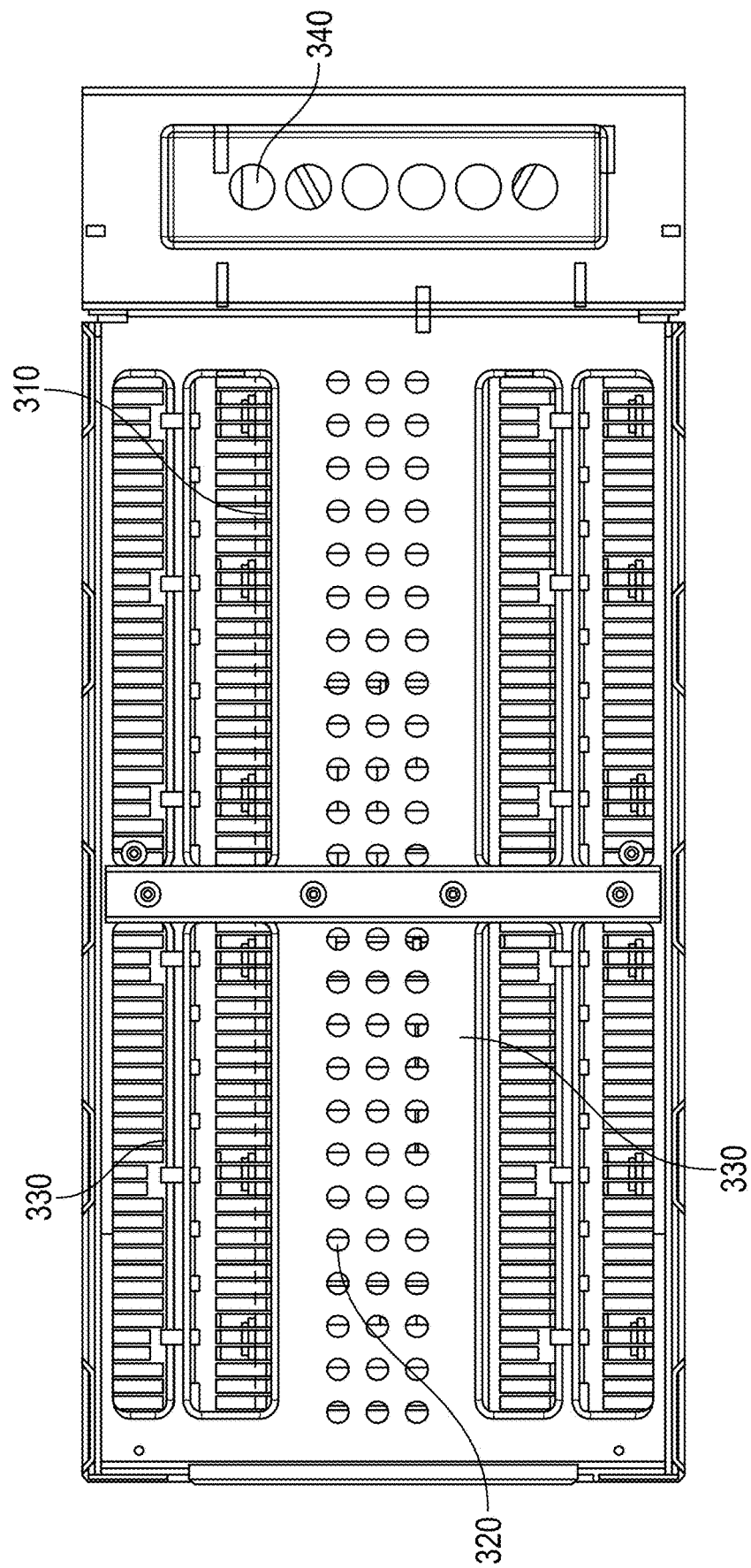
FIG. 8 is a bottom projection view of a computing device to be cooled in the immersed liquid cooling heat dissipation system of the present invention.

As shown in FIGS. 7 and 8, FIG. 7 is a structural schematic view of a flow-equalizing plate of the immersed liquid cooling heat dissipation system of the present invention, and FIG. 8 is a bottom projection view of a computing device to be cooled in the immersed liquid cooling heat dissipation system of the present invention. In the present application, the resistance of computing device to be cooled 300 in different parts is adjusted by providing a flow-equalizing plate 190, so that the flows can be consistent, and thereby the flows for the computing device to be cooled 300 in different parts are relatively consistent, improving heat dissipation performance and efficiency. After the temperatures of the cooling computing devices 300 are consistent, the computing power of each of the cooling computing devices 300 can be effectively increased, the energy efficiency ratio can be reduced, and the flow for the system can be saved, thereby saving the power consumption of the circulating pump.

The flow-equalizing holes 190S on the flow-equalizing plate 190 of the present invention have different sizes, wherein the parts of the regions with higher heat flux density have dense holes, the parts of the regions with lower heat flux density have sparse holes, and some parts of the regions without heat dissipation requirements have no holes, so as to achieve the purpose of equalizing the flows by designing holes of different sizes in different parts, and adjusting the opening ratio and the numbers and specifications of the holes.

In detail, the flow-equalizing plate 190 has a first flow-equalizing hole portion 191 corresponding to the power module 320 and a second flow-equalizing hole portion 192 corresponding to the computing module 330. Because the heat flux density of the computing module 330 is relatively large, that is, the heat flux density of the power module 320 is smaller than that of the computing module 330, the opening ratio of the first flow-equalizing hole portion 191 corresponding to the power module 320 of the flow-equalizing plate 190 is smaller than that of the second flow-equalizing hole portion 192 corresponding to the computing module 330. For example, the first flow-equalizing hole portion 191 is provided with sparse holes, and the second flow-equalizing hole portion 192 is provided with dense holes, or the first flow-equalizing hole portion 191 is provided with fewer holes and the second flow-equalizing hole portion 192 is provided with more holes. Furthermore, alternatively, the first flow-equalizing hole portion 191 is provided with small holes, and the second flow-equalizing hole portion 192 is provided with large holes, and so on.

In this embodiment, there are two computing modules 330 of the computing device to be cooled 300, which are respectively arranged on two sides of the power module 320. Correspondingly, there are two second flow-equalizing hole portions 192 of the flow-equalizing plate 190, which are respectively disposed on both sides of the first flow-equalizing hole portion 191.

In addition, the computing device to be cooled 300 further comprises a connecting module 340, which is a connecting portion such as a power connection line and a signal connection line. The flow-equalizing plate 190 comprises a hole-free portion 193 corresponding to the connecting module 340 of the computing device to be cooled 300. Since the connecting module 193 basically has no heat dissipation requirement, the portion of the flow-equalizing plate 190 corresponding to the connecting module 193 is arranged as hole-free to avoid fluid diversion.

Referring again to FIGS. 1 to 4 and FIG. 13, FIG. 13 is a schematic view of a temperature control application of the immersed liquid cooling heat dissipation system of the present invention. The liquid cooling module 100 comprises a liquid oil inlet 120 and a liquid oil outlet 130. The liquid oil inlets 120 of the liquid cooling module 100 are connected to the cold oil outlet of the cooling circulation device, and the liquid oil outlet 130 of the liquid cooling module 100 is connected to the hot oil inlet of the cooling circulation device. After absorbing the heat of the computing device to be cooled 300, the hot cooling liquid flows out from the liquid oil outlet 130 of the liquid cooling module 100, and the cold cooling liquid cooled by the cooling circulation device enters the liquid cooling module 100 through the liquid oil inlets 120, such that cooling and heat dissipation are circulated in this way.

Wherein, the liquid oil inlets 120 are disposed on the first device slot tank 140 and the second device slot tank 150, and the liquid oil outlet 130 is disposed on the return flow slot tank 160. The cooling liquid enters the first device slot tank 140 and the second device slot tank 150 from the liquid oil inlets 120, and absorbs the heat dissipated from the computing devices 300 to be cooled in the first device slot tank 140 and the second device slot tank 150, after absorbing the heat, the cooling fluid flows into the middle return flow slot tank 160 and enters the cooling circulation device through the liquid oil outlet 130 for cooling circulation.

In the present invention, the liquid oil inlets 120 of the liquid cooling module 100 are lower than the computing devices 300 to be cooled, and the liquid flow direction of the cooling liquid is from bottom to top, so as to cool and dissipate heat for the respective computing devices 300 to be cooled.

The first device slot tank 140, the second device slot tank 150 and the return flow slot tank 160 each are arranged along an extending direction X. The first device slot tank 140 and the second device slot tank 150 have a first end 100A and a second end 100B that are opposite to each other along the extending direction X. The liquid oil inlets 120 and the liquid oil outlet 130 each are disposed at the first end 100A, and the distribution box 500 and the control cabinet 600 are disposed at the second end 100B. In this embodiment, the liquid cooling module 100 is in a shape of a long bar, the cooling circulation device is located at the first end 100A of the liquid cooling module 100 along the extending direction X, and the distribution box 500 and the control cabinet 600 are located at the second end 100B of the liquid cooling module 100 along the extending direction X, and thus the overall structure is compact and is easy to be arranged.

Wherein, the distribution box 500 is connected to the computing devices 300 to be cooled through a power supply line 510, and a first line-reception part 101 for receiving the power supply line 510 is provided on a top portion of the first device slot tank 140 and the second device slot tank 150 on a side connected to the return flow slot tank 160.

The control cabinet 600 is connected to the computing devices 300 to be cooled by a signal line (not shown), and a second line-reception part 102 for receiving the signal line 610 is provided on a top portion of the first device slot tank 140 and the second device slot tank 150 on a side away from the return flow slot tank 160.

The side of the first device slot tank 140 and the second device slot tank 150 close to the return flow slot tank 160 is higher than the side away from the return flow slot tank 160. That is, the liquid cooling module 100 is in a shape of a house with a high middle and low sides. The liquid cooling module 100 further comprises a cover plate 180. The cover plate 180 covers the top portions of the first device slot tank 140, the second device slot tank 150 and the return flow slot tank 160.

The liquid cooling module 100 further comprises oil return ports 170, and the oil return ports 170 are disposed on the wall surfaces between the first device slot tank 140 and the return flow slot tank 160, and on the wall surfaces between the second device slot tank 150 and the return flow slot tank 160. After the cooling liquid in the first device slot tank 140 absorbs heat, it flows back to the return flow slot tank 160 from the oil return ports 170 on the wall surface between the first device slot tank 140 and the return flow slot tank 160. After the cooling liquid in the second device slot tank 150 absorbs heat, it flows back to the return flow slot tank 160 from the oil return ports 170 on the wall surface between the second device slot tank 150 and the return flow slot tank 160. Wherein, the height of the oil return ports 170 is located at the highest liquid level for the computing devices 300 to be cooled.

Wherein, the first device slot tank 140 and the second device slot tank 150 respectively comprise a plurality of unit tank bodies 110, and a plurality of computing devices 300 to be cooled may be arranged in each unit tank body 110. For example, a plurality of computing devices 300 to be cooled may be arranged in a matrix in each unit tank body 110.

Figure 9:
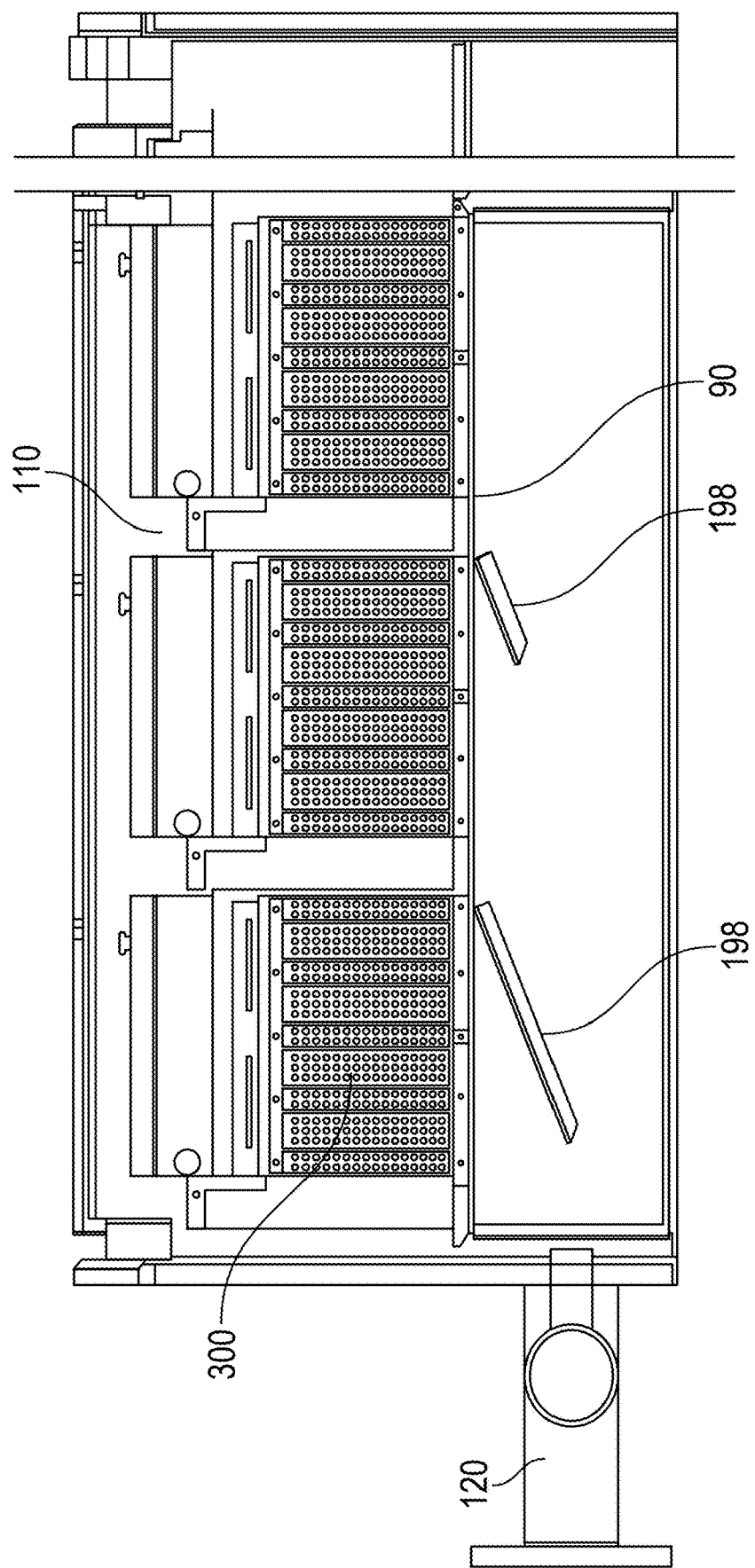
FIG. 9 is a partial cross-sectional structural schematic view of a computing device to be cooled disposed in the immersed liquid cooling heat dissipation system of the present invention.

As shown in FIG. 9, FIG. 9 is a partial cross-sectional structural schematic view of a computing device to be cooled disposed in the immersed liquid cooling heat dissipation system of the present invention. The liquid oil inlets 120 of the liquid cooling module 100 are lower than the bottom portion of the computing devices 300 to be cooled. That is, the liquid oil inlets 120 are lower than the position where the flow-equalizing plate 190 is located. The liquid flow direction of the cooling liquid is from bottom to top, and the cooling liquid passes through the flow-equalizing holes 190S of the flow-equalizing plate 190 and enters each of the computing devices 300 to be cooled, so as to cool and dissipate heat for each of the computing devices 300 to be cooled.

The immersed liquid cooling heat dissipation system 10 further comprises a flow guide 198 obliquely disposed on the bottom portion of the flow-equalizing plate 190, and the flow guide 198 is disposed at an end of the flow-equalizing plate 190 close to the liquid oil inlets 120. In the present application, by disposing the flow guide 198, arrival of the fluid at the computing devices 300 to be cooled at the rear portion is facilitated, such that the flows of the computing devices 300 to be cooled in different parts are relatively consistent, further improving the heat dissipation performance and efficiency.

Wherein, there are a plurality of flow guides, and one of the plurality of flow guides that is closest to the liquid oil inlets 120 has the longest length, so as to prevent the fluid for heat dissipation from gathering at the inlet.

Figure 10:
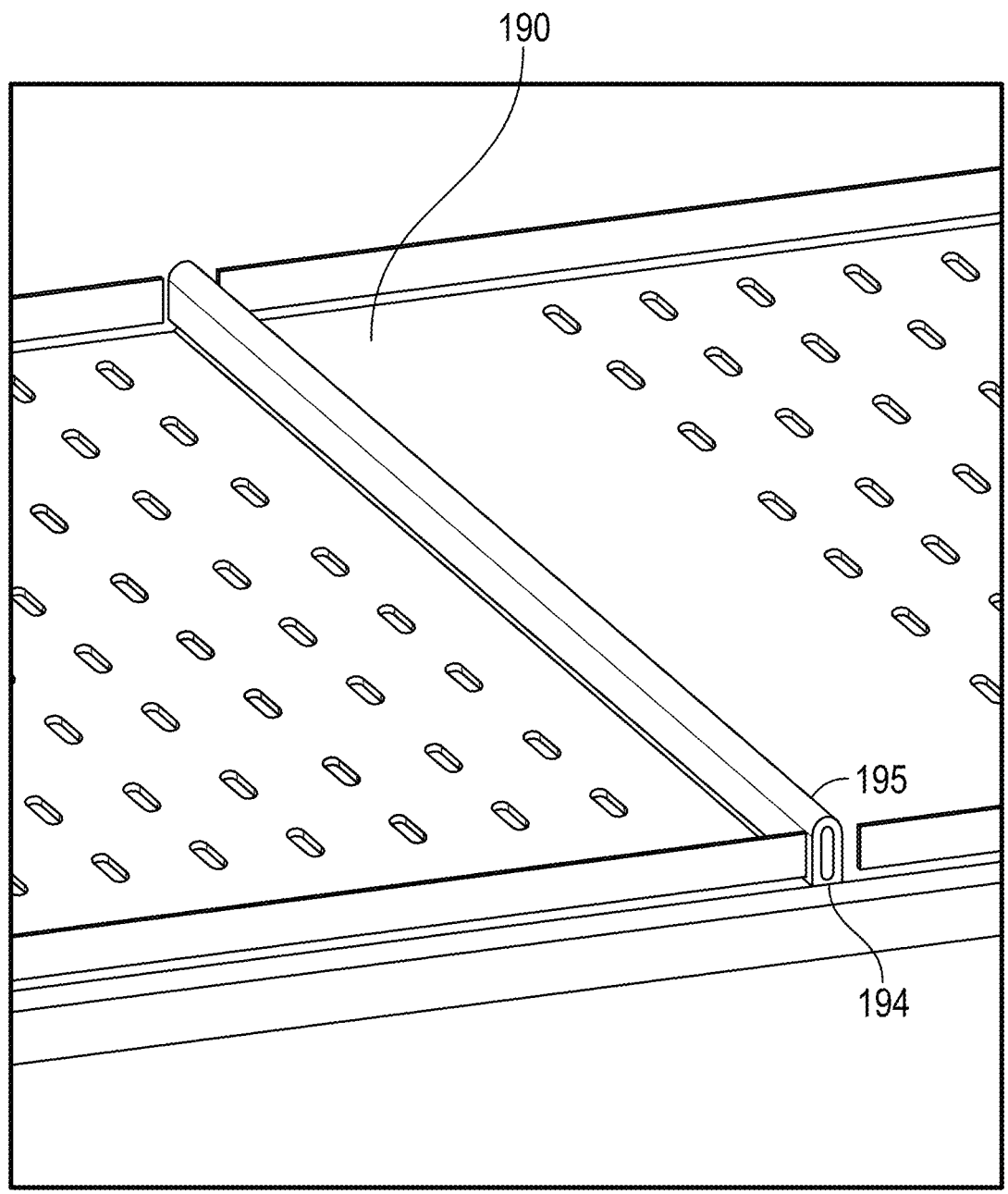
FIG. 10 is a schematic view of a connection structure of the flow-equalizing plate of the immersed liquid cooling heat dissipation system of the present invention.

There are a plurality of flow-equalizing plates 190, wherein, for example, one flow-equalizing plate 190 may be disposed in each unit tank body 110, and adjacent flow-equalizing plates 190 are snap-fitted with each other. In detail, as shown in FIG. 10, FIG. 10 is a schematic view of a connection structure of the flow-equalizing plate of the immersed liquid cooling heat dissipation system of the present invention. At the two ends of the flow-equalizing plate 190 there are respectively provided with a first positioning portion 194 and a second positioning portion 195. The first positioning portion 194 is in a shape of vertical bent, and the second positioning portion 195 is an inverted-U shape. Wherein, the first positioning portion 194 is snap-fitted with the adjacent second positioning portion 195 of the flow-equalizing plate. The first positioning portion 194 and the second positioning portion 195 also serve as a position-limiting structure for the computing devices 300 to be cooled, preventing the computing devices 300 from being displaced.

Figure 11:
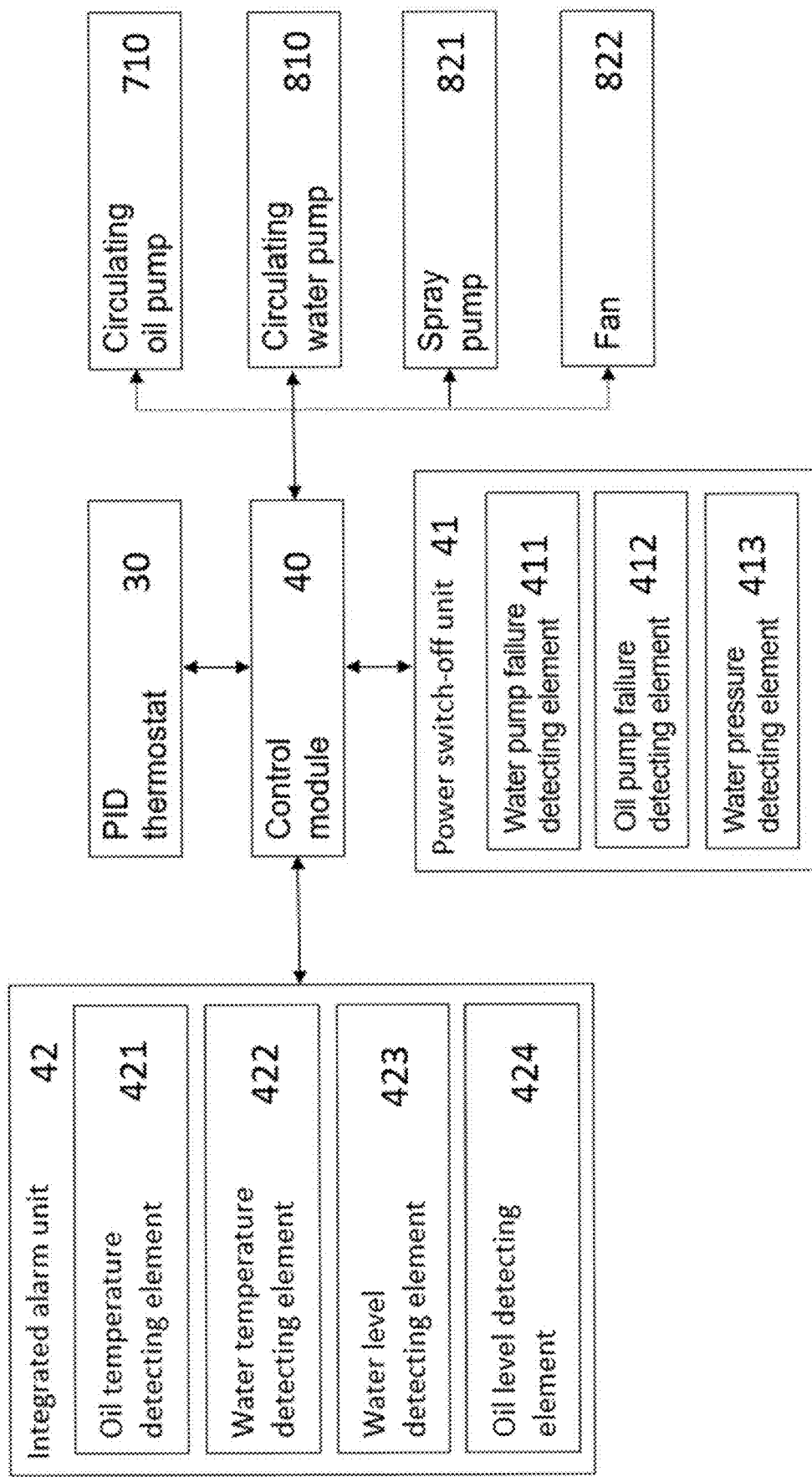
FIG. 11 is a view of a temperature control module of the immersed liquid cooling heat dissipation system of the present invention.
Figure 12:
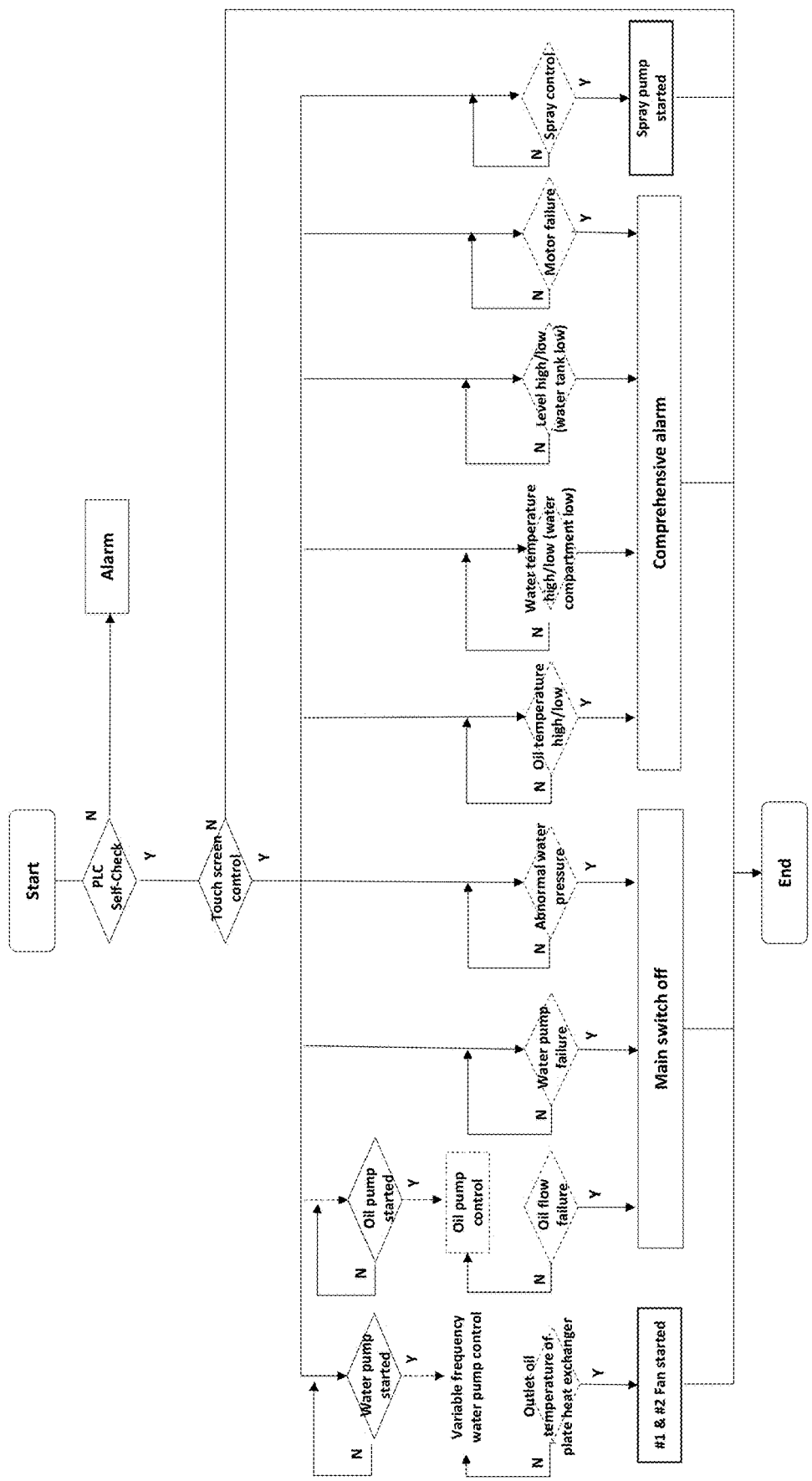
FIG. 12 is a working flow chart of temperature control of the immersed liquid cooling heat dissipation system of the present invention.
Figure 13:
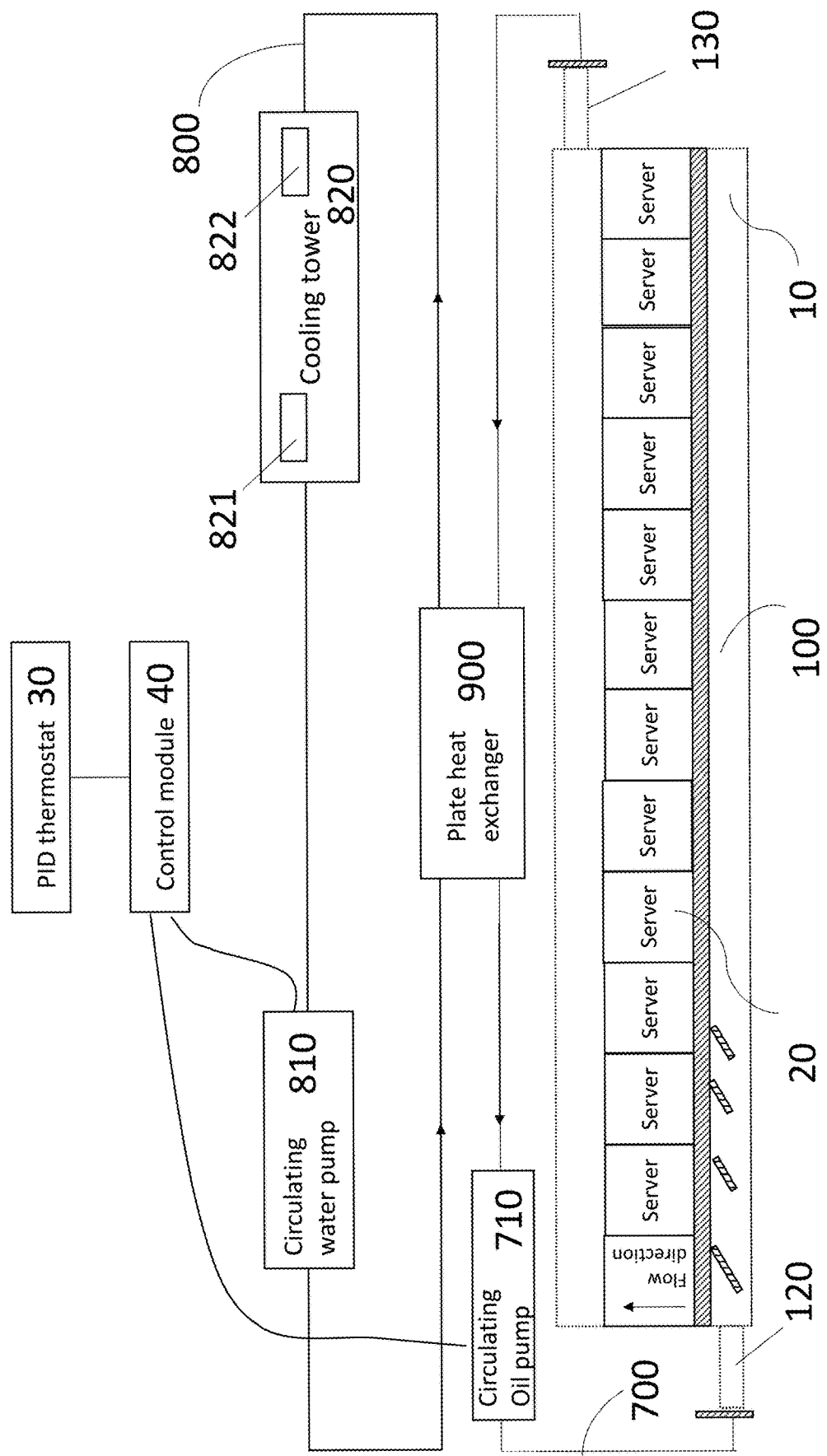
FIG. 13 is a schematic view of a temperature control application of the immersed liquid cooling heat dissipation system of the present invention.

As shown in FIGS. 11 to 13, FIG. 11 is a view of a temperature control module of the immersed liquid cooling heat dissipation system of the present invention, and FIG. 12 is a working flow chart of temperature control of the immersed liquid cooling heat dissipation system of the present invention.

The cooling circulation device of the immersed liquid cooling heat dissipation system 10 comprises an oil circulation cooling assembly 700 and a water circulation cooling assembly 800. The oil circulation cooling assembly 700 is connected to the liquid cooling module 100, and the water circulation cooling assembly 800 exchanges heat with the oil circulation cooling assembly 700. The oil circulation cooling assembly 700 comprises a circulating oil pump 710, and the water circulation cooling assembly 800 comprises a circulating water pump 810. The computing devices 300 to be cooled are disposed in the liquid cooling module 100, and the cooling liquid is circulated through the oil circulation cooling assembly 700, and exchanges heat with the oil circulation cooling assembly 700 through the water circulation cooling assembly 800, that is, the cooling liquid is continuously input and the hot cooling liquid is pumped out, to dissipate heat for the computing devices 300 to be cooled disposed in the liquid cooling module 100.

The present invention further comprises a PID thermostat 30 and a control module 40. The PID thermostat 30 is connected to the control module 40, and the control module 40 is connected to the circulating oil pump 710 of the oil circulation cooling assembly 700 and the circulating water pump 810 of the water circulation cooling assembly 800.

The present invention controls the starts and stops and operating frequencies of the circulating oil pump 710 and the circulating water pump 810 through the PID thermostat 30 and the control module 40, so as to control the computing devices 300 to be cooled in the immersed liquid cooling heat dissipation system 10 to operate at a stable temperature.

The oil circulation cooling assembly 700 and the water circulation cooling assembly 800 are connected through a plate heat exchanger 900. The water circulation cooling assembly 800 further comprises a cooling tower 820, and the cooling tower 820 comprises a spray pump 821, the control module 40 being connected to the spray pump 821.

The circulating oil pump 710 drives the cooling liquid to take away the heat generated by the computing devices 300 to be cooled, and the cooling liquid goes to the plate heat exchanger 900 to release heat and then again circularly cools the computing devices 300 to be cooled. On the other side of the plate heat exchanger 900, the cooling water is driven by the circulating water pump 810, after absorbing the heat on the plate heat exchanger 900, to the plate heat exchanger 900 to release the heat and then returns to the plate heat exchanger 900.

The cooling tower 820 of the water circulation cooling assembly 800 further comprises a fan 822, and the control module 40 is connected to the fan 822. When the outlet oil temperature of the plate heat exchanger 900 is higher than a predetermined value, the control module 40 controls the fan 822 to start.

In detail, referring to FIG. 12, the temperature control process of the immersed liquid cooling heat dissipation system 10 of the present invention is as follows:

The control module 40 starts the circulating oil pump 710, the circulating water pump 810 and the spray pump after a power-on self-check, wherein the circulating water pump 810 is a variable frequency pump. The circulating water pump 810 performs PID closed-loop adjustment according to the oil temperature and the set PID parameters of the PID thermostat 30 to stabilize the oil temperature at an appropriate working point. Since the chip temperature of the computing devices 300 to be cooled has a direct linear relationship with the oil temperature, after the oil temperature stabilizes, the average temperature of the chips of the computing devices 300 to be cooled will also stabilize at a target point, ensuring the normal operation of the computing device to be cooled 300.

When the oil temperature is higher than the target value, the circulating water pump 810 is increased in frequency to reduce the oil temperature and stabilize it at the target value. When the circulating water pump 810 is increased to the highest operating frequency and still cannot meet the condition of stabilizing the oil temperature at the target value, the control module 40 sequentially starts a plurality of fans 822 to control the oil temperature.

With such a temperature control method, when the temperature is high in summer, the oil temperature may be controlled by adjusting the frequency of the circulating water pump 810 and the number of the fans. When the temperature is low in winter, only the circulating water pump 810 is started to control the oil temperature. Meanwhile, since the fan 822 in the cooling tower 820 is disabled, a consistent water temperature in winter and summer may be achieved, avoiding the risk of freezing in winter. Moreover, since the circulating oil pump 710 is always running at the power frequency, the temperature difference of the oil remains unchanged, and the temperature difference of the chips of the computing devices 300 to be cooled will also remain unchanged, which is beneficial to the consistency of the chip temperature.

As shown in FIG. 11, the control module 40 comprises a power switch-off unit 41, and the power switch-off unit 41 comprises a water pump failure detecting element 411, an oil pump failure detecting element 412 and a water pressure detecting element 413.

The control module 40 comprises an integrated alarm unit 42, and the integrated alarm unit comprises an oil temperature detecting element 421, a water temperature detecting element 422, a water level detecting element 423 and an oil level detecting element 424.

In the present invention, when the oil pump failure detecting element 412 detects that the circulating oil pump 710 fails, the water pump failure detecting element 411 detects that the circulating water pump 810 fails, or the water pressure detecting element 412 detects that the water pressure is too low, the power switch-off unit 41 switches off the power supply and stop working to protect the safety of the server cluster of the entire system.

In the present invention, when the oil temperature detecting element 421 detects that the oil temperature of the cooling liquid in the oil circulation cooling assembly 700 is too high or too low, the water temperature detecting element 422 detects that the water temperature of the cooling water in the water circulation cooling assembly 800 is too high or too low, the water level detecting element 423 detects that the water level in the water circulation cooling assembly 800 is too high or too low and the oil level detecting element 424 detects that the oil level in the oil circulation cooling assembly 700 is too high or too low, a comprehensive alarm is given through the integrated alarm unit 42, and the operating personnel are alerted to perform a detection.

The solution of the present invention could control the temperature of the server cluster at a stable temperature, the temperature of the server chips will not fluctuate with the change of the external environment temperature, and the temperature consistency of different chips may also be guaranteed. At the same time, the temperature control scheme takes into account the high-temperature operation in summer and the need for anti-freezing in winter, so that the immersion-type oil-cooled mining machine can adapt to the four seasons of spring, summer, autumn and winter in different geographical locations, and is universal. In addition, the present application takes into account device accidents and abnormal detection parameters, and the main switch is switched off or a comprehensive alarm is given according to different situations.

Of course, the present invention may also have other various embodiments, and without departing from the spirit and essence of the present invention, those skilled in the art can make various corresponding changes and variations according to the present invention, but these corresponding changes and variations should belong to the scope of the appended claims of the present invention

INDUSTRIAL APPLICABILITY

The immersed liquid cooling heat dissipation system of the present invention adopts a flow-equalizing plate, which could greatly improve the flow consistency for computing devices to be cooled in different parts of the liquid cooling module.

In the immersed liquid cooling heat dissipation system of the present invention, the return flow slot tank is located between the device slot tanks on both sides, and the cooling liquid absorbs the heat of the computing devices to be cooled in the device slot tanks and then flows back through the return flow slot tank for cooling. The arrangement is compact and has higher heat dissipation efficiency compared with the traditional air cooling. In addition, the present invention uses a PID thermostat to effectively control the temperature of each computing device to be cooled in the immersed liquid cooling heat dissipation system. When the circulating water pump is raised to the highest operating frequency and still cannot meet the oil temperature stability, the control module starts multiple fans to control the oil temperature.

What is claimed is:

1. An immersed liquid cooling heat dissipation system, comprising
   a liquid cooling module,
   a cooling circulation device, and
   one or more computing devices to be cooled,
   wherein each of the one or more computing devices to be cooled comprises a frame, a control module, a power module, and computing modules, characterized in that the liquid cooling module comprises a flow-equalizing plate on which the computing device to be cooled is disposed,
   the frame comprising a power module accommodating region for accommodating the power module, and a computing module accommodating region for accommodating the computing modules are provided in the frame,
   the frame having a plurality of liquid-through ports for immersed heat dissipation, and
   the flow-equalizing plate having a plurality of flow-equalizing holes thereon,
   wherein the flow-equalizing plate has a first region corresponding to the power module, a second region corresponding to the computing modules, and a third region without heat dissipation requirements, and
   holes of the first region are sparser, smaller in size, or lower in density than that of the second region, and the third region is free of holes.

2. The immersed liquid cooling heat dissipation system according to claim 1, characterized in that the liquid-through ports are disposed on a bottom portion and a top portion of the frame, and the computing module comprises a heat sink, the heat sink having heat sink grooves, and the heat sink grooves being arranged vertically.

3. The immersed liquid cooling heat dissipation system according to claim 1, characterized in that the computing device to be cooled further comprises a connecting module, and the flow-equalizing plate comprises a hole-free portion corresponding to the connecting module.

4. The immersed liquid cooling heat dissipation system according to claim 1, characterized in that there are a plurality of flow-equalizing plates, and adjacent ones of the flow-equalizing plates are snap-fitted with each other.

5. The immersed liquid cooling heat dissipation system according to claim 4, characterized in that both ends of the flow-equalizing plate are respectively provided with a first positioning portion and a second positioning portion, the first positioning portion being a vertical bent, and the second positioning portion being in an inverted-U shape.

6. The immersed liquid cooling heat dissipation system according to claim 1, characterized in that the liquid cooling module further comprises a first device slot tank, a second device slot tank, and a return flow slot tank located between the first device slot tank and the second device slot tank, and the flow-equalizing plates are arranged in the first device slot tank and the second device slot tank.

7. The immersed liquid cooling heat dissipation system according to claim 6, characterized in that the liquid cooling module comprises liquid oil inlets and a liquid oil outlet, the liquid oil inlets being disposed on the first device slot tank and the second device slot tank, and the liquid oil outlet being disposed on the return flow slot tank.

8. The immersed liquid cooling heat dissipation system according to claim 7, characterized in that the first device slot tank, the second device slot tank and the return flow slot tank each are disposed along an extending direction, and the first device slot tank, the second device slot tank and the return flow slot tank have a first end and a second end opposite to each other along the extending direction, the liquid oil inlets and the liquid oil outlet being disposed on the first end.

9. The immersed liquid cooling heat dissipation system according to claim 8, characterized in that the liquid oil inlets are lower than a bottom portion of the computing devices to be cooled.

10. The immersed liquid cooling heat dissipation system according to claim 9, characterized in that it further comprises a distribution box and a control cabinet, and the distribution box and the control cabinet are arranged at the second end.

11. The immersed liquid cooling heat dissipation system according to claim 10, characterized in that the distribution box is connected to the computing devices to be cooled through a power supply line, and a first line-reception part for receiving the power supply line is provided on a top portion of the first device slot tank and the second device slot tank on a side close to the return flow slot tank.

12. The immersed liquid cooling heat dissipation system according to claim 10, characterized in that the control cabinet is connected to the computing devices to be cooled through a signal line, and a second line-reception part for receiving the signal line is provided on a top portion of the first device slot tank and the second device slot tank on a side away from the return flow slot tank.

13. The immersed liquid cooling heat dissipation system according to claim 7, characterized in that it further comprises a plurality of oil return ports, and the oil return ports are disposed on wall surfaces between the first device slot tank and the return flow slot tank and between the second device slot tank and the return flow slot tank.

14. The immersed liquid cooling heat dissipation system according to claim 7, characterized in that it further comprises a flow guide disposed obliquely at a bottom portion of the flow-equalizing plate, and the flow guide is disposed at an end of the flow-equalizing plate close to the liquid oil inlets.

15. The immersed liquid cooling heat dissipation system according to claim 14, characterized in that there are a plurality of flow guides, and one of the plurality of flow guides that is closest to the liquid oil inlets has the longest length.

16. The immersed liquid cooling heat dissipation system according to claim 1, characterized in that the cooling circulation device further comprises an oil circulation cooling assembly, a water circulation cooling assembly, a thermostat and a control module connected to the thermostat, the oil circulation cooling assembly being connected to the liquid cooling module, and the water circulation cooling assembly exchanging heat with the oil circulation cooling assembly, the oil circulation cooling assembly comprising a circulating oil pump, the water circulation cooling assembly comprising a circulating water pump, and the control module being connected to the circulating oil pump and the circulating water pump.

17. The immersed liquid cooling heat dissipation system according to claim 16, characterized in that the water circulation cooling assembly further comprises a cooling tower, the cooling tower comprises a spray pump, and the control module is connected to the spray pump.

18. The immersed liquid cooling heat dissipation system according to claim 17, characterized in that the cooling tower comprises a fan, and the control module is connected to the fan.

19. The immersed liquid cooling heat dissipation system according to claim 18, characterized in that the oil circulation cooling assembly and the water circulation cooling assembly are connected through a plate heat exchanger, and when an oil temperature at an outlet of the plate heat exchanger is higher than a predetermined value, the control module controls the fan to start.

20. The immersed liquid cooling heat dissipation system according to claim 18, characterized in that there are a plurality of fans.

21. The immersed liquid cooling heat dissipation system according to claim 16, characterized in that the control module comprises a power switch-off unit, and the power switch-off unit comprises a water pump failure detecting element, an oil pump failure detecting element and a water pressure detecting element.

22. The immersed liquid cooling heat dissipation system according to claim 16, characterized in that the control module comprises an integrated alarm unit, and the integrated alarm unit comprises an oil temperature detecting element, a water temperature detecting element, a water level detecting element and an oil level detecting element.

* * * * *